United States Patent [19]

Snyder

[11] 4,018,074
[45] Apr. 19, 1977

[54] BELTED AXIAL LEAD ELECTRONIC COMPONENT SPLICING CLIP CRIMPING TOOL

[75] Inventor: Michael D. Snyder, Chenango Bridge, N.Y.

[73] Assignee: Universal Instruments Corporation, Binghamton, N.Y.

[22] Filed: Mar. 8, 1976

[21] Appl. No.: 665,086

[52] U.S. Cl. .................................. 72/410; 29/751; 72/399
[51] Int. Cl.² .......................................... B21D 7/06
[58] Field of Search ............ 72/410, 409, 407, 412, 72/399, 401; 29/203 D, 203 DT, 203 H

[56] References Cited
UNITED STATES PATENTS

| | | |
|---|---|---|
| 1,722,279 | 7/1929 | Davis .................................. 72/409 |
| 2,647,814 | 8/1953 | Chilton .............................. 72/410 |
| 3,133,288 | 5/1964 | Ohgren .............................. 72/407 |
| 3,451,250 | 6/1969 | Rolf .................................... 72/451 |
| 3,571,890 | 3/1971 | Brehm ................................ 72/410 |

*Primary Examiner*—C.W. Lanham
*Assistant Examiner*—Gene P. Crosby
*Attorney, Agent, or Firm*—Fidelman, Wolffe & Waldron

[57] ABSTRACT

A crimping tool for splicing clips is provided with rows of opposed hammers attached to pivoted handles aligned adjacent an anvil assembly on which a splicing clip and two belts of electronic components to be spliced are positioned. Pivoting the handles together causes the hammers and anvil assembly to translate, bending and crimping the clip around the belts.

5 Claims, 6 Drawing Figures

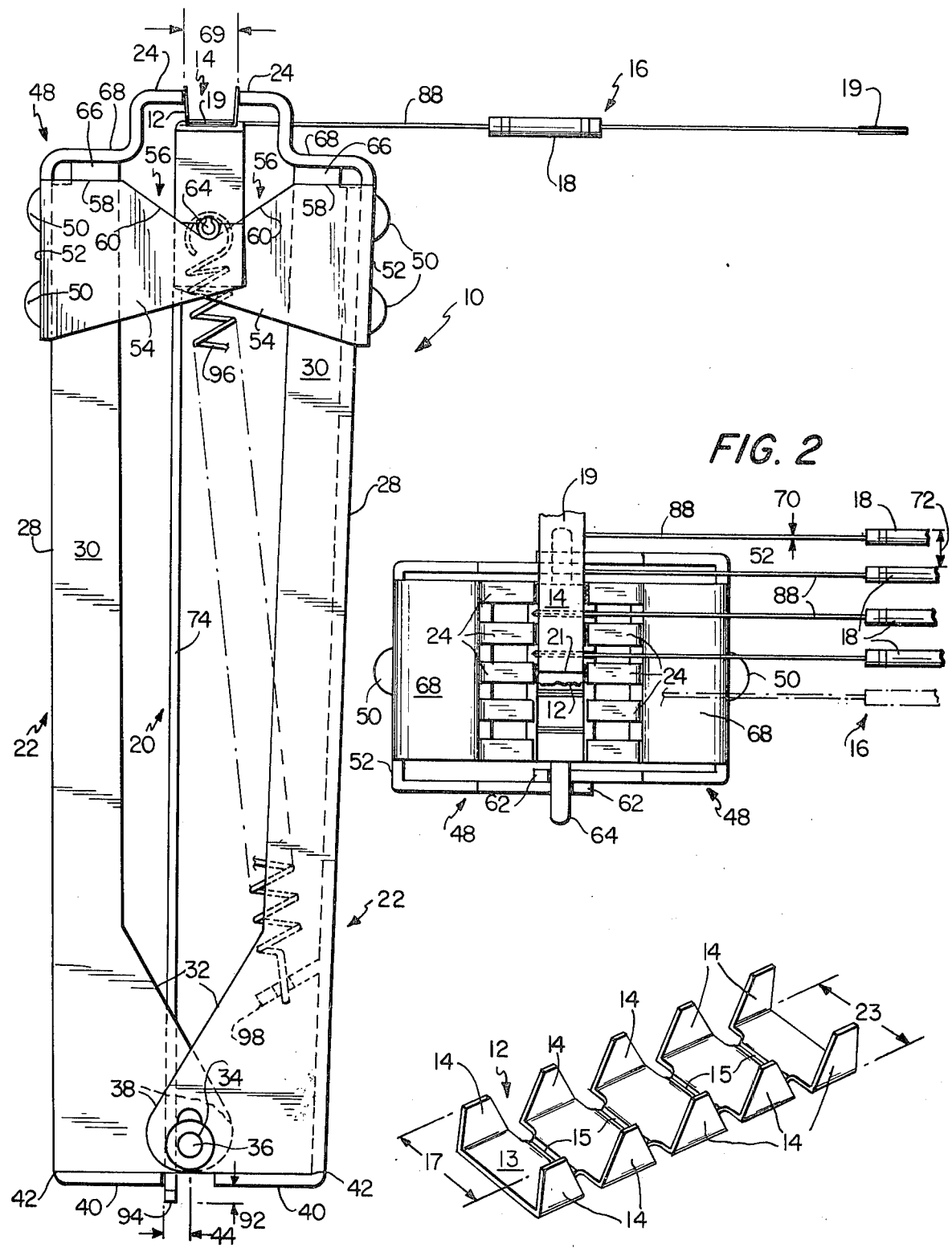

BELTED AXIAL LEAD ELECTRONIC COMPONENT SPLICING CLIP CRIMPING TOOL

BACKGROUND

This invention relates to means for connecting belts of axial lead electronic components and, more specifically, to a tool for bending and crimping clips which interconnect the tapes used to hold the leads thereof. Specifically, this invention is directed to a crimper tool for splicing clips which are intermeshed between the leads of the last components on each end of mating tape sections and bent around the tapes whereby the tapes are bound and the axial leads are equally spaced through the connection area.

The use of belted axial lead electronic components (diodes, etc.) has become in recent years one of the most convenient handling techniques for the electronics industry. The leads of components in this form are prestraightened and aligned and equally spaced on the belt so that they may be fed directly into insertion machines, sequencers or testing devices without intermediate handling. However, in operation of these devices, the belted components are retained on reels which are not endless so either the machines must be shut down periodically to change reels or the end of one reed adhered to another to provide continuous operation. Furthermore, breaks sometimes occur which must be quickly repaired. To splice the belts speedily for these situations, it is essential that the belts of components not only adhere to one another but also that proper spacing between the components be maintained. Staples or glue generally do not insure the spacing while the former will jam equipment due to inability to flex under, for example, rotary indexing and the latter is difficult to handle and may not bind sufficiently in the short time periods before the belt enters the operating area.

Metallic splicing clips comprised of a base with a linear spacing of opposed upstanding, bendable clasps attached to both sides thereof have been used successfully in attaching belts of axial-leaded electronic components. Such a clip is disclosed in U.S. Pat. No. 3,571,862 issued Mar. 23, 1971. The completed joint between belts using a single clip on each belt tape has a desirable degree of strength and flexibility for use in production or test equipment and provides proper spacing between components of adjacent belts. However, the need to bend over and crimp the plurality of clasps, ten or more as shown in the referenced U.S. Pat. No. 3,571,862, has proven awkward and time-consuming. Thus, means are needed to quickly and effectively apply splicing clips having a plurality of clasps which require bending and crimping.

Therefore, it is an object of the instant invention to provide a device for bending and crimping in a single operation a splicing clip having a plurality of opposed clasps so that the ends or breaks in tapes of belted axial lead electronic components are quickly and easily joined with proper alignment and spacing of components.

Another object of this invention is to provide a device for crimping component belts of various widths. Still another object is to provide a device which is inexpensive to produce and portable for use in production and test areas.

These and other objects of the present invention, as well as the features thereof, will become apparent from the following description taken with the accompanying drawing in which:

FIG. 1 is a front elevational view of a crimping tool of this invention with component belt and splicing clip in position for operation.

FIG. 2 is a plan view of the crimping tool of FIG. 1 with one mating belt removed and the splicing clip fragmented.

FIG. 6 is a perspective view of a splicing clip used with the crimping tool of FIG. 1.

Figure 5:
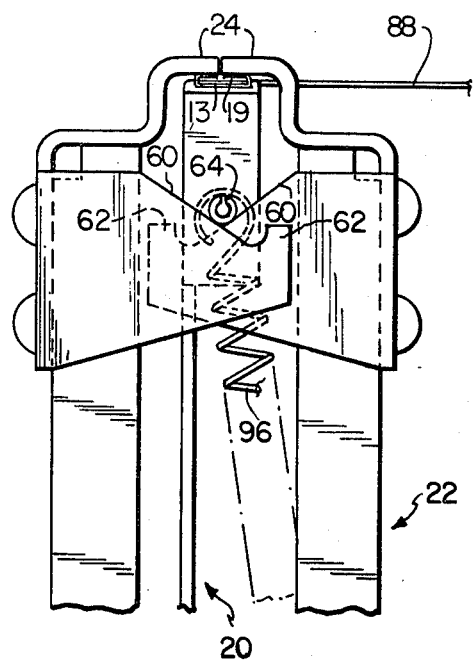
FIG. 5 is a partial front elevational view of the tool of FIG. 1 in the crimping position.
Figure 3:
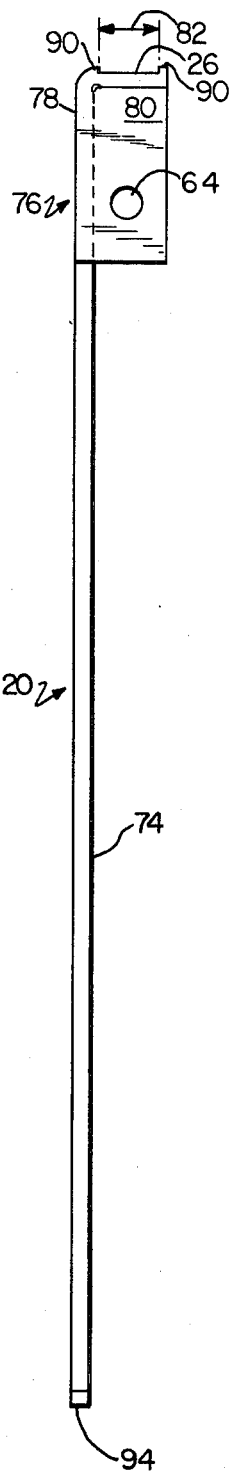
FIG. 3 is a front elevational view of the anvil assembly incorporating anvil surfaces.

The splicing clip crimping device of the instant invention, hereinafter referred to as a crimping tool, is generally indicated as 10 in FIG. 1, as particularly adapted to simultaneously bend and crimp a splicing clip 12 having a plurality of clasp members 14 for binding two discontinuous belts 16 into a continuous belt with equally-spaced electronic components 18 over the splice.

An anvil assembly 20, in which the splicing clip 12 and two belts 16 to be spliced are positioned, is adjacent two rows of opposed hammers 24 attached to pivoted handles 22. Pivoting the handles 22 together causes the hammers 24 and anvil assembly 20 to translate bending and crimping the clip 12 between hammers 24 and anvil assembly 20.

The handles 22 are generally similar and fabricated of a rigid material, e.g., steel, and comprised of a generally flat elongated rectangular base surface 28 having a pair of integral flanges 30 extending generally perpendicularly from the elongated sides of the flat base surface 22 to form a channel-like element. At one end of the handle 22, a tab 32 on each flange 30 extends an increased distance away from the flat base surface 28 including a hole 34 to accommodate a pivot pin 36 passing perpendicularly through each tab 32 near the rounded end 38 of the tab 32. An integral end flange 40 extends perpendicularly from the short edge 42 of the flat base surface 28 adjacent and in the direction of the tabs 32. The end flange length 40 leaves a gap 44 between the end flange 40 and the projected centerline 46 of the aforementioned hole 34 for insertion of the anvil assembly 20 in the gap 44 as explained more fully hereinafter.

The two handles 22 nest, with flanges 30 extended toward the opposing handle, with one tab 32 of the first handle located substantially against the inner surface of one tab 32 of the second handle and the other tab 32 of the first handle located outside and adjacent the other tab 32 of the second handle with the holes 34 in alignment and the pin 36 passing therethrough.

A pair of opposing crimpers 48 formed of heavy gauge sheet metal, e.g., 0.063 inch thick, are fixedly attached, one to each handle 22, by means of rivets 50, or other suitable attachment means, which hold the base 52 of the crimper 48 in substantially flush contact with the base 28 of the handle 22. A rigid arm 54 extends perpendicularly from each side of the crimper base 52 inwardly toward and overlapping the adjacent arm 54 extending from the opposing crimper 48. The upper edge of each arm is contoured to provide a cam profile 56 comprised of a generally horizontal segment 58 nearest the base 52 followed by a linear downwardly (as sen in FIG. 1) sloped segment 60 terminating in an upward projecting mechanical stop 62. A circular arc substantially tangent to the downward-sloped segment blends the sloped segment 60 smoothly into the mechanical stop 62 thereby providing a cradling rest for a circular pin 64 as explained hereinafter.

The crimper base 52, (FIG. 1) adjacent the end 66 of the attached handle 22, bends inward at a right angle toward the opposing crimper 48 to provide a horizontal extension 68 and terminates in a linear row of equi-spaced, tooth-like hammers 24 of equal size which rise vertically from the horizontal extension 68 and then bend inwardly and substantially horizontally toward the opposing crimper 48. Spacing 69 between opposing rows of hammers 24 is less than the width 17 of the splicing clip 14 (FIG. 6) permitting entry of a clip 14 therein only by slight compression together of the outwardly slanting bendable clasps 14. Thus, when the handles 22 are pressed together, pivoting at the pin 36, two opposed rows of hammers 24 translate horizontally, substantially on a collision path, each hammer 24 facing an aligned counterpart hammer 24 attached to the other handle 22. Spacing and width of the hammers 24 correspond to the spacing and width of clasp members 14 on the splicing clip 12, which in turn correspond respectively to the lead diameter 70 and spacing 72 of electronic components 18 on the component belt 16. FIGS. 1 and 2 depict an embodiment including two rows of five hammers on each row.

The anvil assembly 20 is positioned between the handles 22 and crimpers 48 described above and is generally coextensive with them. The anvil assembly 20 is comprised of a flat arm 74 and a plurality of anvil surfaces 26 linearly and uniformly spaced along a holder 76 and generally proximate and parallel with the opposed rows of crimper hammers 24.

Figure 4:
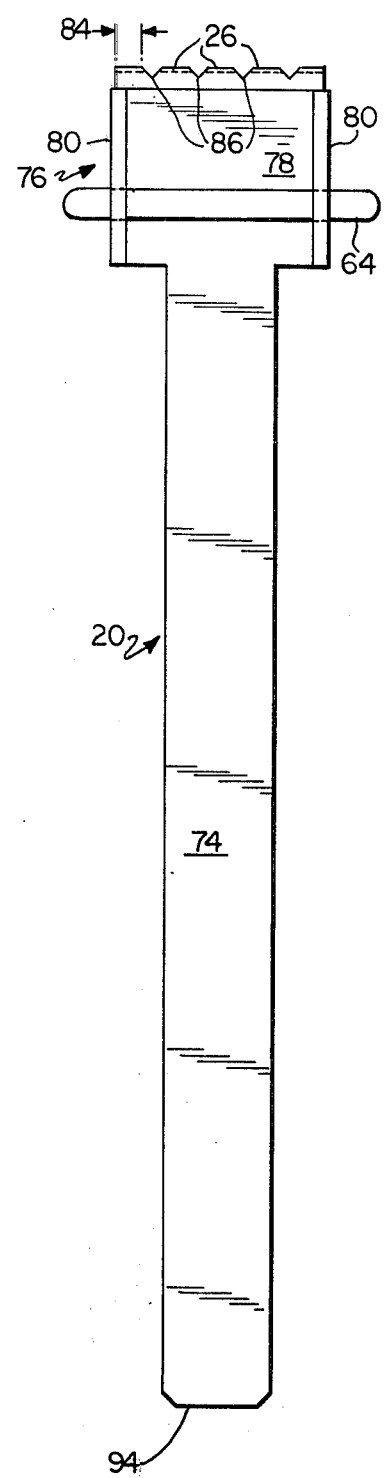
FIG. 4 is a right side view of the anvil assembly of FIG. 3.

The holder 76 is a rigid, shallow, boxlike section having the anvil surfaces 26 on top, attached to a broad, generally rectangular back 78 and supported by two relatively narrow side panels 80. Length 82 of the anvil surfaces 26 generally equals the width 23 of the splicing clip 12 used with the instant invention; the width 84 of the anvil surface 26 generally equals the width of the clasps 14 of the splicing clip 12. Notched grooves 86, dimensioned to receive the wire lead 88 of an electronic-component 18 on the belts 16 to be spliced, separate each anvil surface 26 from the next adjacent surface 26; elevated ridges 90 at the ends of the anvil surfaces laterally constrain a splicing clip 12 placed on the surface 26. FIGS. 2 and 4 depict an embodiment including five anvil surfaces 26.

The arm 74, with its flat surfaces generally parallel to the handle base surfaces 28 and integral and parallel with the holder base 78, extends a distance 92 beyond the end flanges 40 of the handles 22. The remote end 94 of the arm 54 is enclosed off center of the crimping tool 10 in the gap 44 between the pivot pin 36 and the end flange 40 of one handle 22; the thickness and width of the arm providing for a generally free-sliding fit in the gap 44 along all surfaces. A pin 64, through and extended from both side panels 80 of the anvil holder 76, rests on the cam surfaces 60 of the four crimper arms 56. A tension spring 96 is attached, one end to the pin 64 and the other end to a tab 98 protruding inside the handle 22 generally near the pivoted end of the handle, the force thereof drawing and holding the pin 64 at the lowest position along the cam surface 60 in the circular cradle and against the mechanical stop 62 causing the arm 74 of the anvil assembly 20 to be at its greatest extension 92 beyond the end flanges 40 and causing the crimper hammers 24 to be at their greatest separation distance 69 from the opposed hammers 24 and from the anvil surfaces 26. The separation distance 69 between opposed rows of hammers allows passage therebetween by slight compression together of the bendable clasps 14 of a splicing clip 12 having its base 13 down and clasp members 14 oriented generally vertically. The flexible clasps 14 spread outwardly such that the width 23 at the clip base 13 is less than the width 17 at the top of the clasps 14, whereby a splicing clip 12 may be inserted by pressure sufficient to deflect the bendable clasps 14 and positively seated with the base 13 upon the anvil surfaces 26 and bosses 15 of the splicing clip 12 indexed in the notched grooves 86 between anvil surfaces 26; the base 13 of the clip 12 cradles between the guide ridges 90 and each bendable clasp member 14 locates contacting and deflected by the vertical edge of th adjacent hammer 24 (FIG. 1). When the clip 12 is seated, the crests of the bendable clasps 14 extend above the hammers 24.

In operation of the crimping tool 10, a splicing clip 12 is presssed between the hammers 24 and seated on the anvil surfaces 26 as described above. The tape 19 of one belt 16 bearing spaced electronic components 18 and appropriately trimmed is inserted into the seated clip 12 with the first two clasp members 14 at one end of the clip 12 fitting between the leads 88 of the last two components 18 on the tape. The mating tape (not shown) is placed in similar fashion with the last two component leads 88 being placed between the first two clasp members 14 at the other end of the clip 12; this brings the tape ends 21 in substantial juxtaposition. For clarity of illustration, only one tape 19 is shown in FIG. 2.

By manually squeezing the handles 22, the handles, with attached crimpers 48, pivot inwardly about the lower pin 36; the hammers 24 move in a generally horizontal direction bending the opposed clasp members 14 inwardly over the tape 19. Substantially, concurrent with the motion of the hammers 24, the pin 64 attached to the anvil holder 76 is forced to slide upward along the inclined cam surface 60 as the handles 22 swing closertogether. The anvil surfaces 26, now bearing the splicing clip 12 and two positioned component belts 16 move upward in fixed relationship to the pin 64, crimping the bent clasp members 14 between the upper surface of the anvils 26 and the undersurface of the hammers 24.

Upon release of manual pressure from the handles 22, the tensionsal spring 96 draws the holder pin 64 downwardly along the cam surface 60 until the pin 64 again rests against the mechanical stop 62. As the pin 64 slides downward, the handles 22 swing apart, pivoting on the lower pin 36, and the spliced tapes 19 may be removed from between the hammers 24.

In one embodiment of this invention which performs satisfactorily, the handles 22, anvil assembly 20 and crimpers 48 were fabricated of heavy gauge steel sheet, e.g., .062 inch thick, stamped and bent into shape; anvil surfaces 26 were machined and crimpers 48 were case hardened. The crimper tool 10 had approximate dimensions as follows: 7 inches long, 2 inches wide, and 1 inch in depth. Other methods of fabrication, e.g., welded or cast, will be apparent to those versed in the art. Furthermore, the above-described embodiment includes ten hammers 24 and five anvil surfaces 26 suitable for use with a splicing clip 12 having ten clasps 14; however, clips with a greater or lesser number of clasps may also be used in the subject invention and the number of anvil surfaces and hammers may vary in other embodiments. One or a plurality of springs disposed for torsional tensile or compressive action may be used to return the crimper tool to a non-operating position, and a single extended anvil surface may be used in an alternative embodiment to replace the plurality of surfaces 26 separated by grooves 86 described above.

I claim:

1. Apparatus for bending and crimping a splicing clip having a base with linear spacing of opposed upstanding bendable clasps attached to both sides thereof, which interconnects discontinuous belts of axial lead electronic components comprised of:
   a pair of rows of opposed movable hammers, said opposed pairs of hammers being spaced apart allowing passage therebetween of said clip,
   an anvil surface between said rows of hammers to support said clip, said anvil surface being positioned apart from and substantially paralleling said rows of hammers to receive and position said clip passed between said rows of hammers, each of said hammers being aligned with one of said clasps,
   a support holding said anvil surface in a predetermined position relative to said hammers for each position of said movable hammers,
   said opposed rows of movable hammers being individually and rigidly attached to a pair of opposed extended handles, said handles being pivotally connected at their ends remote from said hammers, whereby compressing said handles together moves said opposed pairs of hammers closer together translating over said anvil surface until hammer travel terminates with said hammers adjacent said anvil surface.

2. The apparatus of claim 1 wherein said support holding said anvil surface is translatably mounted whereby translation of said support holding said anvil surface crimps said clasps between said hammers and said anvil surface.

3. The apparatus of claim 1 wherein said support holding said anvil surface bears upon a constraining surface integral with said handles whereby said predetermined relative position between said anvil surface and said hammers is maintained at each position of said handles.

4. The apparatus of claim 3 wherein said constraining surface includes a segment sloping away from said hammers and toward the opposing handle and a mechanical stop projecting from the remote end of said sloping segment; and compressing said handles together causes translation of said hammers over said anvil surface and concurrent movement of said sloping segment and said anvil surface toward said hammers.

5. The apparatus of claim 4 wherein, absent compression on said handles, a spring holds said hammers and said anvil surface in a position constrained by said mechanical stop.

* * * * *